(12) United States Patent
Ichikawa et al.

(10) Patent No.: US 12,274,184 B2
(45) Date of Patent: Apr. 8, 2025

(54) MAGNETORESISTANCE EFFECT ELEMENT

(71) Applicant: TDK CORPORATION, Tokyo (JP)

(72) Inventors: Shinto Ichikawa, Tokyo (JP); Tsuyoshi Suzuki, Tokyo (JP); Katsuyuki Nakada, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 468 days.

(21) Appl. No.: 17/631,571

(22) PCT Filed: Jun. 24, 2020

(86) PCT No.: PCT/JP2020/024874
§ 371 (c)(1),
(2) Date: Jan. 31, 2022

(87) PCT Pub. No.: WO2021/029148
PCT Pub. Date: Feb. 18, 2021

(65) Prior Publication Data
US 2022/0278271 A1    Sep. 1, 2022

(30) Foreign Application Priority Data

Aug. 9, 2019   (JP) .................. 2019-148100

(51) Int. Cl.
*H10N 50/85*   (2023.01)
*H10N 50/10*   (2023.01)
(52) U.S. Cl.
CPC ............. *H10N 50/85* (2023.02); *H10N 50/10* (2023.02)

(58) Field of Classification Search
CPC .............................. H10N 50/85; H10N 50/10
USPC .......................................................... 257/421
See application file for complete search history.

(56) References Cited

U.S. PATENT DOCUMENTS

| | | | |
|---|---|---|---|
| 11,456,361 B1* | 9/2022 | Atanackovic | ..... H01L 21/02631 |
| 2009/0091863 A1* | 4/2009 | Hosotani | ................ H10N 50/10 |
| 2012/0091548 A1 | 4/2012 | Sukegawa et al. | |
| 2013/0003579 A1 | 1/2013 | Lu et al. | |
| 2013/0221461 A1 | 8/2013 | Sukegawa et al. | |
| 2016/0005957 A1* | 1/2016 | Kodaira | ............. H01L 21/3065 |
| | | | 438/3 |
| 2017/0338402 A1 | 11/2017 | Hu et al. | |

(Continued)

FOREIGN PATENT DOCUMENTS

| | | |
|---|---|---|
| JP | 2009-094104 A | 4/2009 |
| JP | 2013-175615 A | 9/2013 |

(Continued)

OTHER PUBLICATIONS

Sukegawa et al., "Tunnel magnetoresistance with improved bias voltage dependence in lattice-matched Fe/spinel MgAl2O4/Fe(001) junctions," Applied Physics Letters, 2010, vol. 96, pp. 212505-1-212505-3.

(Continued)

*Primary Examiner* — Jami Valentine Miller
(74) *Attorney, Agent, or Firm* — Oliff PLC

(57) ABSTRACT

In the magnetoresistance effect element according to one aspect, the metal oxide constituting the metal oxide layer has the ratio of oxygen higher than the total ratio of metal when the composition is expressed in the stoichiometric composition; and the resistivity of the metal oxide layer is higher than that of the tunnel barrier layer.

19 Claims, 7 Drawing Sheets

(56) References Cited

U.S. PATENT DOCUMENTS

| | | | |
|---|---|---|---|
| 2018/0090671 A1 | 3/2018 | Kato et al. | |
| 2019/0006074 A1* | 1/2019 | Inubushi | H03B 15/006 |
| 2019/0088855 A1* | 3/2019 | Yamakawa | H10N 50/80 |
| 2019/0108865 A1* | 4/2019 | Sasaki | G01R 33/093 |
| 2019/0189910 A1* | 6/2019 | Patel | H10N 50/85 |
| 2019/0386662 A1* | 12/2019 | Lin | H01F 10/329 |
| 2020/0044144 A1 | 2/2020 | Sukegawa et al. | |
| 2021/0407943 A1* | 12/2021 | Rajashekhar | H10N 70/021 |
| 2022/0165937 A1* | 5/2022 | Lille | H10N 50/80 |
| 2023/0143766 A1* | 5/2023 | Atanackovic | H01L 21/02175 257/43 |
| 2024/0107893 A1* | 3/2024 | Okamura | H01F 10/1936 |

FOREIGN PATENT DOCUMENTS

| | | |
|---|---|---|
| JP | 5586028 B2 | 9/2014 |
| JP | 5588019 B2 | 9/2014 |
| JP | 6116694 B2 | 4/2017 |
| JP | 2018-056272 A | 4/2018 |
| JP | 2019-047119 A | 3/2019 |
| JP | 2019-057643 A | 4/2019 |
| WO | 2018/230466 A1 | 12/2018 |

OTHER PUBLICATIONS

Miura et al., "First-principles study of tunneling magnetoresistance in Fe/MgAl2O4/Fe(001) magnetic tunnel junctions," Physical Review B, 2012, vol. 86, pp. 024426-1-024426-6.

Scheike et al., "Lattice-matched magnetic tunnel junctions using a Heusler alloy Co2FeAl and a cation-disorder spinel Mg—Al—O barrier," Applied Physics Letters, 2014, vol. 105, pp. 242407-1-242407-5.

Sep. 15, 2020 International Search Report issued in International Patent Application No. PCT/JP2020/024874.

* cited by examiner

MAGNETORESISTANCE EFFECT ELEMENT

TECHNICAL FIELD

The present invention relates to a magnetoresistance effect element.

Priority is claimed on Japanese Patent Application No. 2019-148100 filed in Japan on Aug. 9, 2019, the content of which is incorporated herein by reference.

BACKGROUND ART

Giant magnetoresistance (GMR) effect elements made of a multilayer film of a ferromagnetic layer and a non-magnetic layer, and tunnel magnetoresistance (TMR) effect elements using an insulating layer (tunnel barrier layer, barrier layer) as the non-magnetic layer are known. Generally, a TMR element has a higher element resistance than a GMR element, but a higher magnetoresistance (MR) ratio. TNIR elements are attracting attention as elements for magnetic sensors, high-frequency components, magnetic heads, and non-volatile random access memory (MRAM).

TMR elements can be classified into two types based on the difference in the mechanism of electron tunnel conduction. One is a TMR element that utilizes only the exudation effect (tunnel effect) of the wave function between ferromagnetic layers. The other is a TMR element in which a coherent tunnel in which the symmetry of the wave function is maintained (only electrons having the symmetry of a specific wave function tunnel) is dominant. By using the TMR element in which a coherent tunnel is dominant, a large MR ratio can be obtained compared with a TMR element using only the tunnel effect.

Patent Literature 1 describes a cap layer on the surface of the free layer opposite to the tunnel barrier layer as an additional element to the fixed layer, the tunnel barrier layer and the free layer, which are the basic structures of the magnetic tunnel junction (MTJ) of the TMR element. It is described that the strength and stability of the perpendicular magnetic anisotropy are improved by providing the cap layer.

In Patent Literature 1, it is studied that the film thickness of the cap layer (metal oxide layer) is made thinner than the film thickness of the tunnel barrier layer to suppress the increase in resistance of the TMR element due to providing the cap layer.

By providing the cap layer, improvement in crystallinity, interfacial magnetic anisotropy, etc, of the free layer can be expected.

CITATION LIST

Patent Literature

Patent Literature 1: Japanese Patent (Granted) Publication No. 6116694 (B)

SUMMARY OF INVENTION

Technical Problem

The advantages of providing the cap layer are as described above, but the disadvantage is an increase in the resistance value of the magnetoresistance effect element.

An increase in element resistance hinders the integration of elements and the reduction of power consumption.

If the film thickness of the cap layer is reduced as studied in Patent Literature 1, the element is likely to be destroyed and the controllability of the element is deteriorated.

In view of such circumstances, it is an object of the present invention to provide a magnetoresistance effect element that suppresses an increase in area resistance due to providing a cap layer without reducing the thickness of the cap layer.

Solution to Problem

The present inventors examined the material of the metal oxide layer as the cap layer, and reduced the resistivity (electrical resistivity) inherent to the material. The present invention provides the following means for solving the above problems.

(1) A magnetoresistance effect element including: a first ferromagnetic layer; a second ferromagnetic layer; a tunnel barrier layer disposed between the first and second ferromagnetic layers; and a metal oxide layer in contact with a surface of the second ferromagnetic layer opposite to a surface in contact with the tunnel barrier layer, wherein a ratio of oxygen is higher than a total ratio of metal elements in a composition formula expressed in a stoichiometric composition in a metal oxide constituting the metal oxide layer.

(2) A magnetoresistance effect element including: a first ferromagnetic layer; a second ferromagnetic layer; a tunnel barrier layer disposed between the first and second ferromagnetic layers; and a metal oxide layer in contact with a surface of the second ferromagnetic layer opposite to a surface in contact with the tunnel barrier layer, wherein a ratio of oxygen is higher than a total ratio of metal elements in a composition formula expressed in a stoichiometric composition in a metal oxide constituting the metal oxide layer, and an oxygen deficiency ratio of the metal oxide layer is higher than an oxygen deficiency ratio of the tunnel barrier layer.

(3) A magnetoresistance effect element including: a first ferromagnetic layer; a second ferromagnetic layer; a tunnel barrier layer disposed between the first and second ferromagnetic layers; and a metal oxide layer in contact with a surface of the second ferromagnetic layer opposite to a surface in contact with the tunnel barrier layer, wherein a ratio of oxygen is higher than a total ratio of metal elements in a composition formula expressed in a stoichiometric composition in a metal oxide constituting the metal oxide layer, and a barrier height of the metal oxide constituting the metal oxide layer is higher than a barrier height of an oxide constituting of the tunnel barrier layer.

(4) In the magnetoresistance effect element according to the above-described aspect (3), the barrier height of the metal oxide constituting the metal oxide layer may be less than a barrier height of MgO film having a same film thickness as the metal oxide layer.

(5) In the magnetoresistance effect element according to any one of the above-described aspects, the metal oxide layer may have a spinel structure containing one or more of divalent elements and one or more of trivalent elements selected from a group consisting of Mg, Al, Ga, Ti, In, Sn, Zn, Ge, Ag, Cu, Mn, Si, In, Pt, Cr, V, Rh, Mo, W, Fe, Co, and Ni.

(6) In the magnetoresistance effect element according to any of the above-described aspects, the metal oxide layer may be made of $A_xB_{1-x}O_y$ (A=Mg, Sn, Zn, Ge, Cu, Mn, Si, Ti, Pt, V, Fe, Co; B=Al, Ga, In, Sn, Ge, Ag, Cu, Mn, Ti, Cr, V, Rh, Mo, Fe, Ni; $0 \leq x \leq 1$; $0.133 \leq y < 1.2$).

(7) In the magnetoresistance effect element according to the above-described aspect (6), the metal oxide layer may contain an oxide containing Mg and Al, and the tunnel barrier layer may contain an oxide of Mg.

(8) In the magnetoresistance effect element according to the above-described aspect (6), each of the metal oxide layer and the tunnel barrier layer may be made of an oxide containing Mg and Al and having a spinel structure.

(9) In the magnetoresistance effect element according to any one of the above-described aspects, an oxygen concentration on a first surface of the metal oxide layer may be less than an oxygen concentration on a second surface of the metal oxide layer, the first surface in contact with the second ferromagnetic layer and the second surface facing the first surface.

(10) In the magnetoresistance effect element according to any one of the above-described aspects, the tunnel barrier layer may be an oxide layer containing Mg, and the metal oxide layer may be a layer made of one or more layers made of $A_xB_{1-x}O_y$ (A=Mg, Zn, Ti; B=Al, Ga, In, Ge, Ti; 0≤x≤1; 0.33≤y≤1.2).

(11) In the magnetoresistance effect element according to any one of (1) to (9) above, the tunnel barrier layer may be a layer made of an oxide containing Mg and Al, and the metal oxide layer may be a layer made of one or more layers made of $A_xB_{1-x}O_y$ (A=Mg, Zn, Ti; B=Al, Ga, In, Ge, Ti; 0≤x≤1; 0.133≤y<1.2).

(12) in the magnetoresistance effect element according to any one of (1) to (9) above, the tunnel barrier layer may be a layer made of an oxide containing Mg and Ga, and the metal oxide layer may be a layer made of one or more layers made of $A_xB_{1-x}O_y$ (A=Mg, Zn, Ti; B=Ga, In, Ge, Ti; 0≤x≤1; 0.133≤y<1.2).

(13) In the magnetoresistance effect element according to any one of (1) to (9) above, the tunnel barrier layer may be a layer made of an oxide containing Mg and Ge, and the metal oxide layer may be a layer made of one or more layers made of $A_xB_{1-x}O_y$ (A=Mg, Zn, Ti; B=Ga, in, Ge, Ti; 0≤x≤1; 0.133≤y<1.2).

(14) The magnetoresistance effect sensor according to any one of (1) to (13) above, may further comprise one or more sets of a layer made of a third ferromagnetic layer and a second metal oxide layer on the metal oxide layer, and the third ferromagnetic layer is disposed on a side of the tunnel barrier layer with respect to the second metal oxide layer of the set the third ferromagnetic layer belongs to.

(15) In the magnetic resistance effect element according to (14) above, the magnetoresistance effect element may comprise one set of the layer made of a third ferromagnetic layer and a second metal oxide layer on the metal oxide layer, the third ferromagnetic layer contacts a surface of the metal oxide layer opposite to a surface in contact with the second ferromagnetic layer, and the second metal oxide layer contacts a surface of third ferromagnetic layer opposite to a surface in contact with the metal oxide layer.

Advantageous Effects of Invention

In the magnetoresistance effect element according to the aspects of the present invention, the increase in area resistance due to providing the cap layer can be suppressed without reducing the thickness of the cap layer.

DESCRIPTION OF EMBODIMENTS

Hereinafter, the present invention will be described in detail with reference to the drawings as appropriate. The drawings used in the following description may be enlarged for convenience in order to make the features of the present invention easy to understand, and the dimensional ratios of the respective components may differ from the actual ones. The materials, dimensions, and the like exemplified in the following description are examples, and the present invention not limited thereto, and the present invention can be appropriately modified without changing the gist thereof, (Magnetic Resistance Effect Element)

Figure 1:
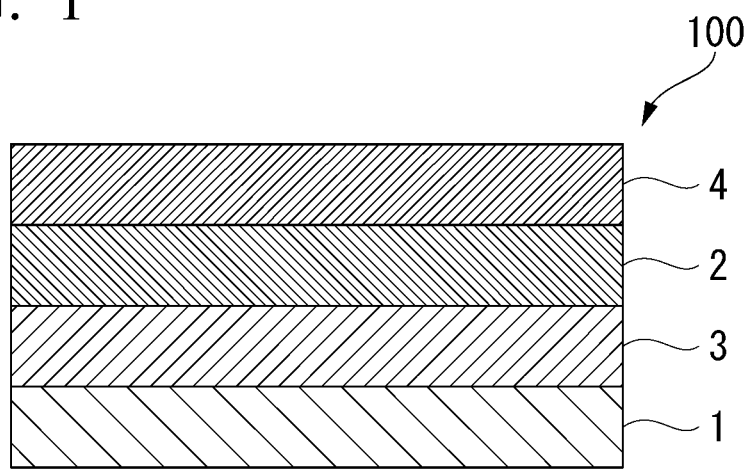
FIG. 1 is a cross-sectional view of a magnetoresistance effect element according to an embodiment of the present invention.
Figure 2:
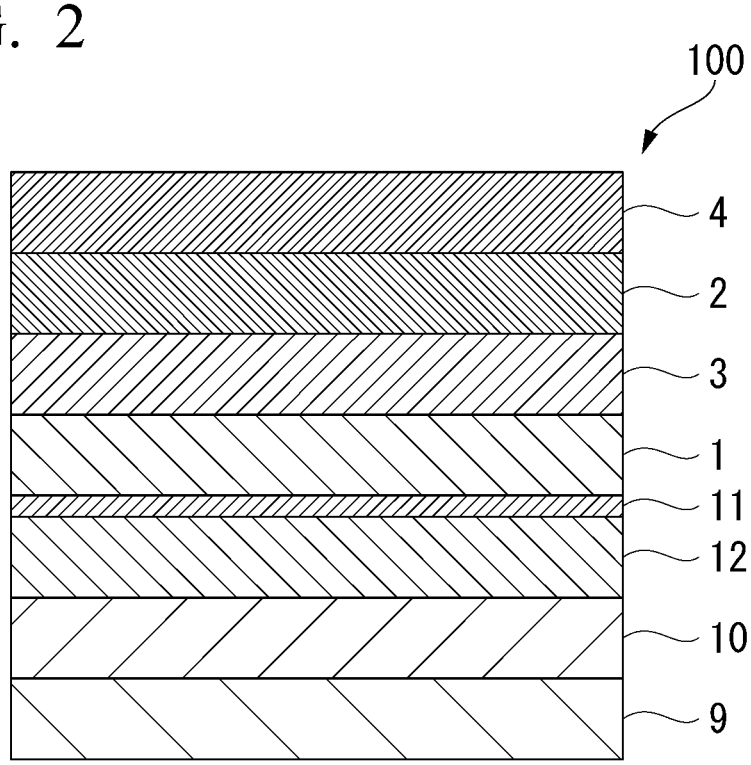
FIG. 2 is a cross-sectional view of a modified example of the magnetoresistancc effect element according to the embodiment of the present invention.

FIG. 1 is a cross-sectional view of the magnetoresistance effect element according to the present embodiment. FIG. 1 is a cross-sectional view of the magnetoresistance effect element 100 cut along the lamination direction of each layer of the magnetoresistance effect element. The magnetoresistance effect element 100 has a first ferromagnetic layer 1, a second ferromagnetic layer 2, a tunnel barrier layer 3, and a metal oxide layer 4. As shown in FIG. 2, the magnetoresistance effect element 100 may have an underlayer or the like in addition to these layers (for example, the underlayer 9, the antiferromagnetic layer 10, the non-magnetic layer 11 and the fourth ferromagnetic layer 12). The tunnel barrier layer 3 is an example of an insulating layer.

[First Ferromagnetic Layer, Second Ferromagnetic Layer]

The first ferromagnetic layer 1 and the second ferromagnetic layer 2 are made of magnetic materials. The first ferromagnetic layer 1 and the second ferromagnetic layer 2 are magnetized, respectively. The magnetoresistance effect element 100 outputs a change in the relative angle between the magnetization of the first ferromagnetic layer 1 and the magnetization of the second ferromagnetic layer 2 as a resistance value change.

The magnetization of the first ferromagnetic layer 1 is harder to move than, for example, the magnetization of the second ferromagnetic layer 2. When a predetermined external force is applied, the direction of magnetization of the first ferromagnetic layer 1 does not change (fixed), and the direction of magnetization of the second ferromagnetic layer 2 changes. The resistance value of the magnetoresistance effect element 100 changes as the direction of magnetization of the second ferromagnetic layer 2 changes with respect to the direction of magnetization of the first ferromagnetic layer 1. In this case, the first ferromagnetic layer 1 is called a magnetization fixed layer, and the second ferromagnetic layer 2 may be called a magnetization free layer. Hereinafter, a case where the first ferromagnetic layer 1 is a magnetization fixed layer and the second ferromagnetic layer 2 is a magnetization free layer will be described as an example.

The first ferromagnetic layer 1 and the second ferromagnetic layer 2 include a ferromagnetic material. The ferromagnetic material constituting the first ferromagnetic layer 1 and the second ferromagnetic layer 2 is, for example, a metal selected from the group consisting of Cr, Mn, Co, Fe and Ni, and an alloy containing one or more of these metals. These metals and at least one or more elements of B, C, and N are included in the alloy. The first ferromagnetic layer 1 and the second ferromagnetic layer 2 contain, for example, an Fe element. The first ferromagnetic layer 1 and the second ferromagnetic layer 2 containing the Fe element have a high spin polarization rate, and the MR ratio of the magnetoresistance effect element 100 increases. The first ferromagnetic layer 1 and the second ferromagnetic layer 2 are, for example, Fe, Co—Fe, Co—Fe—B, and Ni—Fe.

The first ferromagnetic layer 1 and the second ferromagnetic layer 2 may be a Haussler alloy. Heusler alloy is a half-metal and has a high spin polarization ratio. The Hensler alloy is an intermetallic compound having a chemical composition of XYZ or $X_2YZ$, where X is a transition metal element or a noble metal element of the Co—Fe—Ni—Cu group on the periodic table; Y is a transition metal or an elemental species of X of the Mn—V—Cr—Cu group on the periodic table; and Z is a typical element of Group III to Group V on the periodic table. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$ and the like.

The thickness of the second ferromagnetic layer 2 is, for example, 2.5 nm or less. When the thickness of the second ferromagnetic layer 2 is thin, interfacial magnetic anisotropy occurs at the interface between the second ferromagnetic layer 2 and the tunnel barrier layer 3, and it becomes easier for the magnetization direction of the second ferromagnetic layer 2 to be oriented in a direction perpendicular to the lamination surface.

A layer containing a metal selected from the group consisting of Mg, Ta, Ti, W, and Mo; or a layer made of an alloy containing one or more of these metals may be inserted into the second ferromagnetic layer 2. The film thickness may be 0.15 nm or more and 1 nm or less.

In order to make the first ferromagnetic layer 1 a fixed layer, the coercive force of the first ferromagnetic layer 1 is made larger than that of the second ferromagnetic layer 2. For example, as shown in FIG. 2, when an antiferromagnetic layer 10 such as IrMn or PtMn is adjacent to the first ferromagnetic layer 1, the coercive force of the first ferromagnetic layer 1 becomes large, for example. Alternatively, in order to prevent the leakage magnetic field of the first ferromagnetic layer 1 from affecting the second ferromagnetic layer 2, a structure of the synthetic ferromagnetic coupling may be used. In the structure, the antiferromagnetic layer 10, the fourth ferromagnetic layer 12, the non-magnetic metal layer 11, and the first ferromagnetic layer 1 are laminated in the order. Ru, Ir, and Rh may be used for the non-magnetic metal layer.

The first ferromagnetic layer 1 can be a fixed layer having the perpendicular magnetic anisotropy by forming the first ferromagnetic layer 1 by Co, a Co/Pt multilayer film, a Co/Pd multilayer film, a CoCr alloy, a CoCrPt alloy, a FePt alloy, an SinCo alloy containing a rare earth, and a TbFeCo alloy.

[Tunnel Barrier Layer]

The tunnel barrier layer 3 contains an oxide (magnetic oxide or non-magnetic oxide). This oxide is, for example, an oxide containing: Mg; and at least one of Al and Ga. This oxide is represented by, for example, Mg—(Al, Ga)—O. Since the ratio of Mg to Al or Ga is not determined, the composition notation of the oxide is often expressed as described above without using subscripts.

The tunnel barrier layer 3 may contain an oxide of Mg.

The tunnel barrier layer 3 has a NaCl structure or a spinel structure (including a ordered spinel structure and an disordered spinel structure) as a crystal structure. The composition of the oxide constituting the ordered spinel structure and the oxide constituting the disordered spinel structure may be the same or different. For example, the oxide constituting the ordered spinel structure may be an oxide containing Mg and Ga (Mg—Ga—O), and the oxide constituting the disordered spinel structure may be an oxide containing Mg and Al(Mg—Al—O). The spinet structure may be an inverse spinel structure as well as a normal spinel structure.

The tunnel barrier layer 3 may be a layer expressed by one of composition formulae selected from the group consisting of: MgO, $MgAl_2O_4$, $MgGa_2O_4$ and $Mg_2GeO_4$ in the stoichiometric composition formula.

The tunnel barrier layer 3 may be amorphous made of alumina or the like, for example.

The tunnel barrier layer 3 may be made of $CoFe_2O_4$, $NiFe_2O_4$, $NiCo_2O_4$, $Fe_3O_4$, or, $\gamma\text{-}Fe_2O_3$ in the case where the oxide is a magnetic oxide.

[Metal Oxide Layer]

The metal oxide layer 4 is a metal oxide layer provided on a surface of the second ferromagnetic layer 2 opposite to the surface in contact with the tunnel barrier layer 3. The metal oxide layer 4 is a layer made of a metal oxide.

B sandwiching the second ferromagnetic layer 2 between the metal oxide layer 4 and the tunnel barrier layer 3, the crystallinity of the second ferromagnetic layer 2 is improved.

Further, by providing the metal oxide layer 4 on the surface of the second ferromagnetic layer 2 opposite to the surface in contact with the tunnel barrier layer 3, the perpendicular magnetic anisotropy of the second ferromagnetic layer 2 is improved.

In terms of the arrangement position of the metal oxide layer 4, the only requirement is that relative relationship between the tunnel barrier layer 3 and the second ferromagnetic layer 2 is satisfied. Thus, it is not limited to the arrangement position shown in the drawings.

In terms case of a magnetoresistance effect element having a bottom pin structure in which the first ferromagnetic layer 1, the tunnel barrier layer 3, and the second ferromagnetic layer 2 are laminated in this order from the lower side, the metal oxide layer 4 provided on the second ferromagnetic layer 2 is referred to as "a cap layer," Alternatively, it is included in a cap layer.

In the case of a magnetoresistance effect element having a top pin structure in which the second ferromagnetic layer 2, the tunnel barrier layer 3, and the first ferromagnetic layer 1 are laminated in this order from the lower side, the metal oxide layer 4 provided underneath the second ferromagnetic layer 2 is referred to as "an underlayer." Alternatively, it is included in an underlayer.

The resistivity of the metal oxide layer 4 is set lower than the resistivity of the tunnel barrier layer 3. The resistivity referred to here means the inherent resistivity of a composition having a constant chemical composition, and the unit is Ω·cm. The resistivity is a physical property value that does not depend on the shape and dimensions of the conductor.

Therefore, it is different from the resistance value that changes by changing the layer thickness of the oxide layer having the same composition, for example.

That is, it means that the inherent resistivity of the metal oxide constituting the metal oxide layer 4 is lower than the resistivity of the metal oxide constituting the tunnel barrier layer 3.

In order to set the resistivity of the metal oxide layer 4 to be lower than the resistivity of the tunnel barrier layer 3, it is necessary to appropriately set the film forming conditions of each layer. The specific methods include: reducing the amount of oxygen in the metal oxide layer 4 to be less than the amount of oxygen in the tunnel barrier layer 3; and setting the barrier height of the metal oxide layer 4 to a value less than that of the tunnel barrier layer 3.

In the case where the post-oxidation method is used in which oxygen is introduced into the chamber to oxidize the metal oxide layer 4 and the tunnel barrier layer 3 after forming an alloy, the condition is set in such a way that the oxygen amount introduced into the chamber when the metal oxide layer is formed is less than the oxygen amount introduced into the chamber when the tunnel barrier layer is formed.

The amount of oxygen introduced in forming the metal oxide layer is set to be 10% to 90% of the amount of oxygen introduced in forming the tunnel barrier layer.

The metal oxide layer and the tunnel barrier layer may be formed by direct film formation using an oxide target or by reactive film formation in which oxygen is introduced when the alloy is formed. At this time, it is necessary to adjust the composition of the oxide target and the amount of oxygen to be introduced so that the amount of oxygen in the metal oxide layer is less than the amount of oxygen in the tunnel barrier layer.

The resistivity can be obtained from the measured value of the resistivity of the target layer. Even if it is difficult to measure the measured value, a layer having the same composition is formed by a known method (for example, a film is formed on an appropriate substrate with a thickness of 5 μm), and the measured value of the resistivity of the film is measured. By doing so, the resistivity inherent to the metal compound can be obtained.

The resistivity of the metal oxide layer 4 is preferably 10% or more lower than the resistivity of the tunnel barrier layer 3.

When this condition is satisfied, the metal oxide layer 4 may be an oxide made of Mg.

The oxygen deficiency ratio of the metal oxide layer 4 is set higher than the oxygen deficiency ratio of the tunnel barrier layer 3.

The oxygen deficiency ratio is a deficiency ratio from the reference value of the measured oxygen amount based on the case where the oxide constituting the predetermined layer has a stoichiometric composition. For example, when the oxide is represented by $MgAl_2O_{4-\delta}$, the oxygen deficiency ratio is calculated as follows. $MgAl_2O_{4-\delta}$ is an oxide of magnesium and aluminum, and is represented by $MgAl_2O_4$ in the stoichiometric composition Therefore, the reference oxygen amount of the oxide is the case where the subscript of oxygen is 4. The oxygen deficiency ratio is the rate of deficiency from the reference value, and in this case, the oxygen deficiency ratio is $\delta/4 \times 100(\%)$. The oxygen deficiency ratio of the metal oxide layer 4 is preferably 30% or more and 90% or less, and more preferably 40% or more and 80% or less.

When the oxygen deficiency ratio increases, the electrons trapped in oxygen function as carriers, and the resistivity of the metal oxide layer 4 decreases.

The barrier height of the metal oxide constituting the metal oxide layer 4 is set lower than the barrier height of the oxide constituting the tunnel barrier layer 3.

Barrier height is the energy required to allow electrons to pass through the material. For example, in the case of the tunnel barrier layer 3, it is the energy required for passing electrons between the first ferromagnetic layer 1 and the second ferromagnetic layer 2 through the tunnel barrier layer 3. The lower the barrier height, the lower the resistivity.

Table 1 shows examples of barrier heights of typical oxides.

TABLE 1

| Oxide | Barrier Height (eV) |
|---|---|
| MgO | 7.6 |
| $MgAl_2O_4$ | 7.8 |
| $Al_2O_3$ | 8.7 |
| $MgAlGaO_4(Al_{0.5}, Ga_{0.5})$ | 6.35 |
| $MgAlGaO_4(Al_{0.25}, Ga_{0.75})$ | 5.62 |
| $MgAlGaO_4(Al_{0.75}, Ga_{0.25})$ | 7.08 |
| $MgGa_2O_4$ | 4.9 |
| $MgTiO_4$ | 4.25 |
| $ZnAl_2O_4$ | 3.85 |

The barrier height of the metal oxide constituting the metal oxide layer 4 may be set to be less than the barrier height of MgO having the same film thickness.

Further, the barrier height of the metal oxide constituting the metal oxide layer 4 may be set to 7.1 eV or less.

When the metal oxide constituting the metal oxide layer 4 is expressed in stoichiometric composition, the ratio of oxygen in the composition formula is set higher than the total ratio of metal elements. "The ratio of oxygen and the total ratio of metal elements in the composition formula when expressed in stoichiometric composition" is obtained by the following procedure. For example, in the case of a compound whose stoichiometric composition is represented by $MgAl_2O_4$, the composition ratio of Mg, Al and O is 1:2:4. Therefore, the ratio of oxygen in the composition formula is 4, and the total ratio of metal elements in the composition formula is 3, That is, $MgAl_2O_4$ corresponds to a material in which the ratio of oxygen in the composition formula is higher than the total ratio of metal elements when expressed in stoichiometric composition. Examples of oxides in which the ratio of oxygen in the composition formula is higher than the total ratio of metal elements when expressed in stoichiometric composition include oxides having a spinel structure and oxides having a perovskite structure. For example, the metal oxide layer 4 is made of an oxide including a divalent element and a trivalent element. Each of the divalent element and the trivalent element contains one or more of elements selected from the group consisting of Mg, Al, Ga, Ti, In, Sn, Zn, Ge, Ag, Cu, Mn, Si, In, Pt, Cr, V, Rh, Mo, W, Fe, Co and Ni. The oxide constituting the metal oxide layer 4 may have a spinel structure. The spinel structure may be an inverse spinel structure as well as a normal spinel structure.

The metal oxide layer 4 may be made of a compound expressed by composition formula $A_xB_{1-x}O_y$ (A=Mg, Sn, Zn, Ge, Cu, Mn, Si, Ti, Pt, V, Fe, Co; B=Al, Ga, In, Sn, Ge, Ag, Cu, Mn, Ti, Cr, V, Rh, Mo, W, Fe, Ni; $0 \le x \le 1$; $0.133 \le y < 1.2$), A expressing a divalent cation and B expressing a trivalent cation.

The metal oxide layer 4 may contain an oxide containing Mg and Al, and may have a spinel structure. The spinel structure may be an inverse spinel structure as well as a normal spinel structure.

In the case where the tunnel barrier layer 3 is an oxide layer of Mg, the metal oxide layer may be a layer made of one or more layers made of $A_{x\_1}B_{1-x}O_y$ (A=Mg, Zn, Ti; B=Al, Ga, In, Ge, Ti; $0 \le x \le 1$; $0.33 \le y < 1.2$).

In the case where the tunnel barrier layer 3 is an oxide layer of Mg and Al, the metal oxide layer may be a layer made of one or more layers made of $A_xB_{1-x}O_y$ (A=Mg, Zn, Ti; B Al, Ga, In, Ge, Ti; $0 \le x \le 1$; $0.133 \le y < 1.2$).

In the case where the tunnel barrier layer 3 is an oxide layer of Mg and Ga, the metal oxide layer may be a layer made of one or more layers made of $A_xB_{1-x}O_y$ (A=Mg, Zn, Ti; B Ga, In, Ge, Ti; $0 \le x \le 1$; $0.133 \le y < 1.2$).

When both the tunnel barrier layer and the metal oxide layer are made of the same material, the oxygen deficiency ratio of the metal oxide layer is higher than the oxygen deficiency ratio of the tunnel barrier layer. Therefore, even when the stoichiometric composition formula of the tunnel barrier layer and the metal oxide layer is the same, the resistivity of the metal oxide layer is lower than the resistivity of the tunnel barrier layer.

The tunnel barrier layer may be an oxide layer of Mg and Ga, and the metal oxide layer 4 may be a layer made of one or more layers made of $A_xB_{1-x}O_y$ (A=Mg, Zn, Ti; B=Ga, an in, Ge, Ti; $0 \le x \le 1$; $0.133 \le y < 1.2$).

Figure 3:
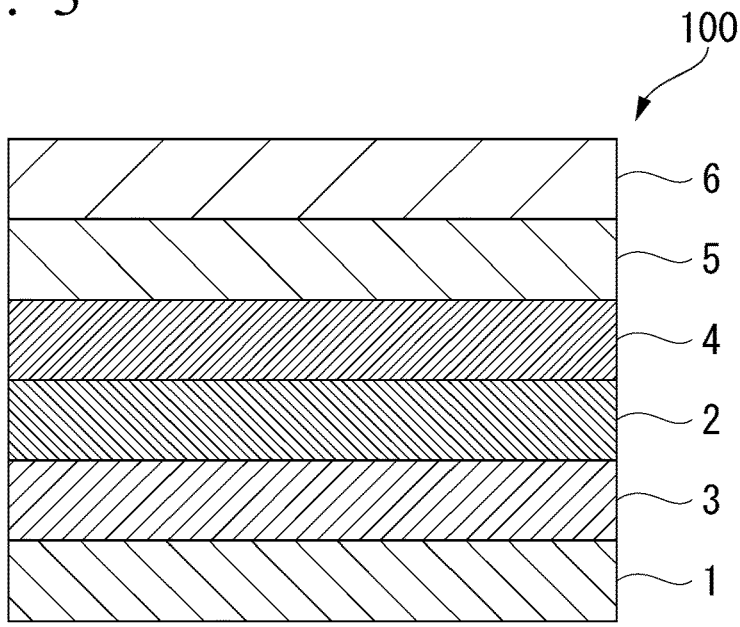
FIG. 3 is a cross-sectional view of a magnetoresistance effect element according to another embodiment of the present invention.

The metal oxide layer 4 functions as a single body. Alternatively, the functional layer 5 and the electrode 6 may be provided on the surface of the metal oxide layer opposite to the surface in contact with the second ferromagnetic layer from the metal oxide layer 4 in the order as shown in FIG. 3. For example, the functional layer 5 is made of the same material as the second ferromagnetic layer 2 such as CoFeB, FeB, and CoB, The electrode 6 contains a highly conductive material. For example, the electrode 6 is made of Al, Ag, Cu, or Ru.

The metal oxide layer 4 alone may be referred to as a cap layer, or the metal oxide layer 4, the functional layer 5, and the electrode 6 may be referred to as a cap layer.

Figure 4:
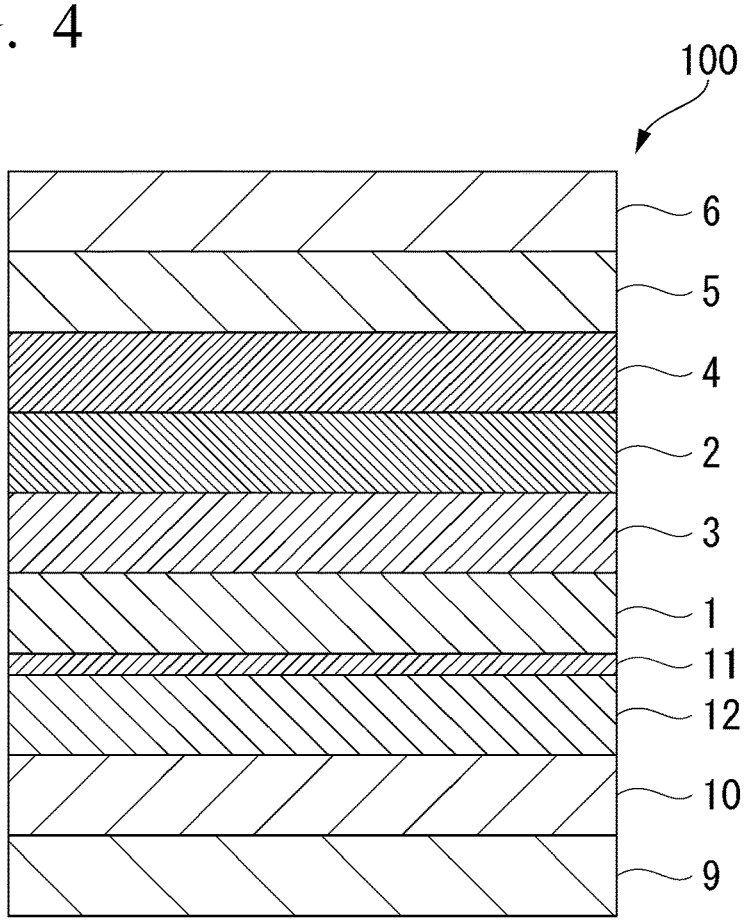
FIG. 4 is a cross-sectional view of a modified example of the magnetoresistance effect element according to another embodiment of the present invention.

As in the above-described case where the functional layer 5 and electrode 6 are not provided, a structure of the synthetic ferromagnetic coupling may be used when they are provided as shown in FIG. 4. In the structure, the antiferromagnetic layer 10, such as IrMn, PtMn or the like, is provided adjacent to the first ferromagnetic layer 1; and the antiferromagnetic layer 10, the fourth ferromagnetic layer 12, the non-magnetic metal layer 11, and the first ferromagnetic layer 1 are laminated in the order.

The oxygen concentration in the metal oxide layer 4 may be constant, or the concentration may change in the lamination direction. In the metal oxide layer 4, the oxygen concentration on the first surface in contact with the second ferromagnetic layer may be less than the oxygen concentration on a second surface facing the first surface.

By increasing the oxygen concentration on the first surface close to the second ferromagnetic layer 2, the oxygen of the metal oxide layer 4 and the ferromagnetic element of the second ferromagnetic layer 2 are coupled, the perpendicular magnetic anisotropy (PMA) of the second ferromagnetic layer 2 can be improved. Further, oxygen on the second surface far from the second ferromagnetic layer 2 hardly couples to the ferromagnetic element of the second ferromagnetic layer 2, and has a small influence on the perpendicular magnetic anisotropy (PMA). By lowering the oxygen concentration on the second surface, the electrons trapped in the oxygen function as carriers, and the resistivity of the metal oxide layer 4 can be lowered.

The oxygen concentration in the metal oxide layer 4 can be controlled by appropriately setting the formation conditions when the metal oxide layer 4 is formed.

In the formation of the metal Oxide layer 4, when oxygen is introduced into the chamber after the alloy is formed and the post-oxidation method is used to oxidize the metal oxide layer 4, introducing oxygen after formation of the alloy is repeated multiple times. The amount of oxygen introduced is set to decrease as the distance from the second ferromagnetic layer 2 increases.

For example, when the oxygen partial pressure and the oxygen flow rate at the start of film formation of the metal oxide layer 4 are set to 100%, the amount of oxygen introduced in the final round is set to be reduced to at least 10%.

By making the oxygen concentration of the first surface of the metal oxide layer 4 in contact with the second ferromagnetic layer 2 higher than the oxygen concentration of the opposite second surface, the perpendicular magnetic anisotropy of the second ferromagnetic layer 2 is improved. And, the reduction of the resistance of the magnetoresistance effect element can be achieved more effectively.

Figure 5:
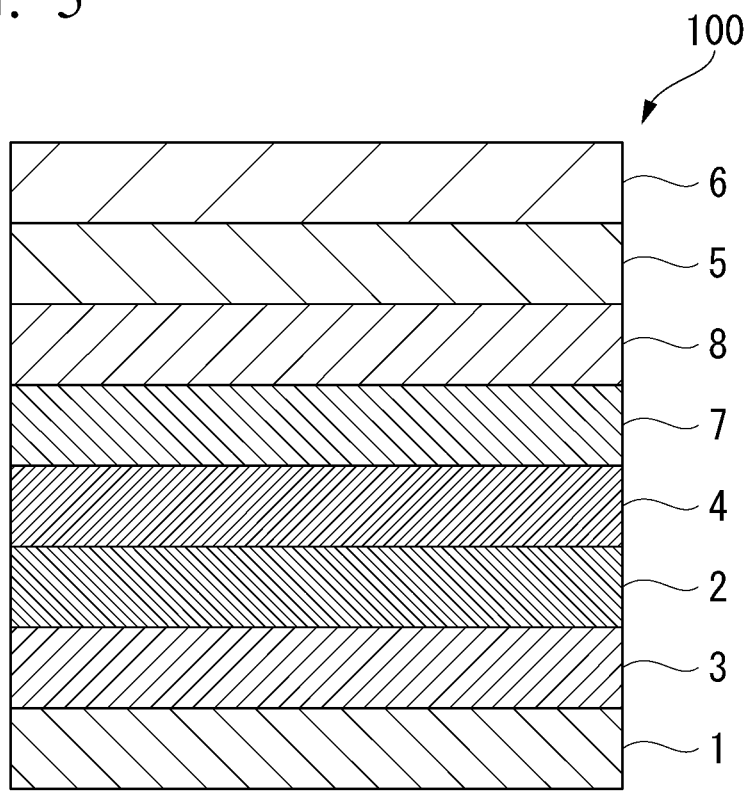
FIG. 5 is a cross-sectional view of a magnetoresistance effect element according to another embodiment of the present invention.

Further, as shown in FIG. 5, a set of layers including a ferromagnetic layer and a metal oxide layer may be further formed on the metal oxide layer 4, Only one set of the two-layer set may be provided, or multiple sets (for example, 5 sets or less) may be provided in an overlapping manner. The third ferromagnetic layer is located closer to the tunnel barrier layer than the second metal oxide layer belonging to the set.

When only one set is provided, the third ferromagnetic layer 7 is in contact with the surface of the metal oxide layer 4 opposite to the surface in contact with the second ferromagnetic layer 2, and the second metal oxide layer 8 is in contact with the surface of the third ferromagnetic layer 7 opposite to the surface in contact with the metal oxide layer 4.

In the case where multiple sets are provided and in the set adjacent to the metal oxide layer 4, as in the case where only one set is provided, the third ferromagnetic layer 7 is in contact with the surface of the metal oxide layer 4 opposite to the surface in contact with the second ferromagnetic layer 2, and the second metal oxide layer 8 is in contact with the surface of the third ferromagnetic layer 7 opposite to the surface in contact with the metal oxide layer 4.

In the case where multiple sets are provided and in the other adjacent sets, the third ferromagnetic layer 7 is in contact with the second metal oxide layer 8 belonging to the other set just below the set (adjacent on the tunnel barrier layer side), and the second metal oxide layer 8 is in contact with the third ferromagnetic layer 7 belonging to the set.

Figure 6:
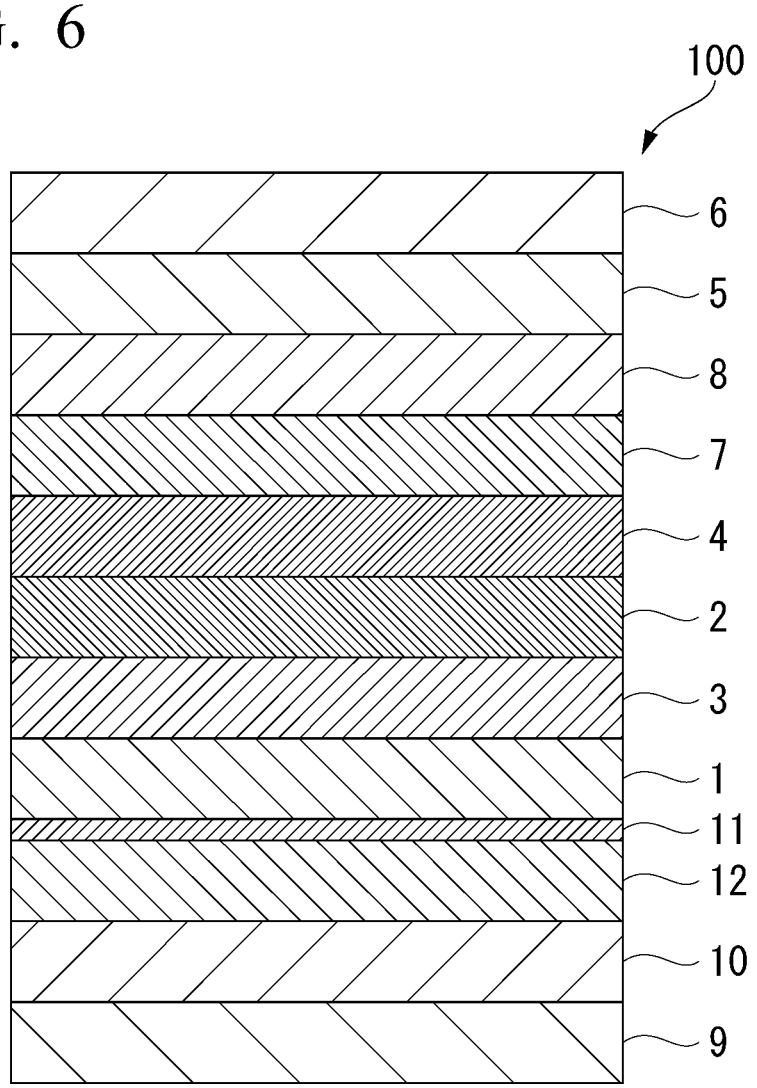
FIG. 6 is a cross-sectional view of a modified example of the magnetoresistancc effect element according to another embodiment of the present invention.

As in the above-described case where the set made of the ferromagnetic layer and the metal oxide layer is not provided on the metal oxide layer 4, a structure of the synthetic ferromagnetic coupling may be used when the set is further provided on the metal oxide layer 4 as shown in FIG. 6. In the structure, the antiferromagnetic layer 10, such as irMn, PtMn or the like, is provided adjacent to the First ferromagnetic layer 1; and the antiferromagnetic layer 10, the fourth ferromagnetic layer 12, the non-magnetic metal layer 11, and the first ferromagnetic layer 1 are laminated in the order.

For example, the third ferromagnetic layer 7 and the second metal oxide layer 8 are formed on the metal oxide layer 4 (first metal oxide layer 4) in this order.

The third ferromagnetic layer 7 causes interfacial magnetic anisotropy at the interface with the first metal oxide layer 4 and the interface with the second metal oxide layer 7. As a result, the direction of magnetization of the third ferromagnetic layer 7 tends to be oriented perpendicular to the laminated surface. Further, the second ferromagnetic layer 8 magnetically coupled to the third ferromagnetic layer 7 also tends to be oriented in the perpendicular direction.

As the material of the second metal oxide layer 8, the same material as that of the metal oxide layer 4 can be used.

As the material of the third ferromagnetic layer 7, the same materials as those of the first ferromagnetic layer and the second ferromagnetic layer can be used.

Further, a ferromagnetic layer and a metal oxide layer may be repeatedly formed on the second metal oxide layer in this order.

The change in oxygen concentration in the lamination direction of the metal oxide layer 4 can be measured by, for example, a combination of TEM (transmission electron microscope) and EDS (energy dispersive X-ray analysis). The analysis result of TEM-EDS was obtained by subtracting the background signal of the measurement element (the constituent metal of the metal oxide layer and O).

[Measurement Method of MR Ratio]

The magnetoresistance effect element 100 is arranged at a position where the first wiring electrically connected to the underlayer 9 also serving as the lower electrode and the electrode electrically connected to the electrode 6 intersect. The contact 101 is provided on the underlayer, and the contact is connected to the power supply 102 and the voltmeter 103. By applying a current from the power source, a current flows in the lamination direction of the magnetoresistance effect element 100. The potential difference of the magnetoresistance effect element 100 at this time is monitored by the voltmeter 103. Then, by applying a current or voltage to the magnetoresistance effect element 100 while sweeping a magnetic field from the outside, a resistance change of the magnetoresistance effect element 100 is observed.

Figure 9:
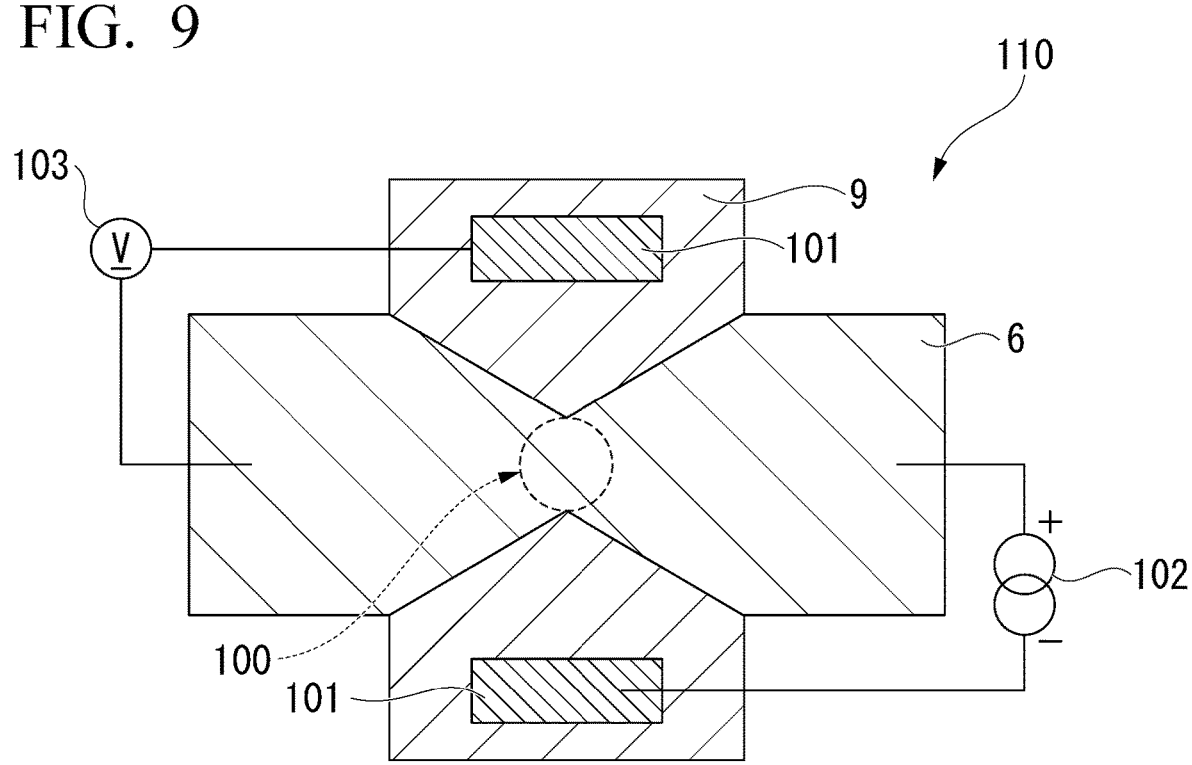
FIG. 9 is a schematic view of a magnetoresistance effect device used for measuring the MR ratio of the magnetoresistance effect element manufactured in the embodiment as viewed in a plan view from the lamination direction.

For the measurement of the MR ratio, a magnetoresistance effect device showing a schematic view in a plan view from the lamination direction in FIG. 9 can be used.

The MR ratio was calculated from the following formula.

MR ratio (%)=$(R_{AP}-R_P)/R_P \times 100$ $R_P$ is the resistance in the case of parallel first ferromagnetic layer 1 and the second magnetization direction of the ferromagnetic layer 2, $R_{AP}$ is the magnetization direction of the first ferromagnetic layer 1 and the second ferromagnetic layer 2 This is the resistance in the case of antiparallel.

[Measuring Method of PMA Strength]

The PMA strength of the magnetization free layer is defined as the magnetic field when the resistance of the magnetoresistance effect element 100 is minimized when a magnetic field is applied from the outside in a direction parallel to the magnetization direction of the magnetization fixed layer.

EXAMPLE

Comparative Example 4

The magnetoresistance effect element 100 shown in FIG. 1 was manufactured on a Si substrate (underlayer 9)with a thermal oxide film. First, an underlayer 9 having a Ta5 nm/Ru5 nm was obtained on the Si substrate with a thermal oxide film. Then, as the antiferromagnetic layer 10, 10 nm of IrMn; 3 nmn of the fourth ferromagnetic layer 12 made of CoFe; 0.8 nm of the non-magnetic metal layer 11 made of Ru; and 3 of the first ferromagnetic layer 1 made of CoFeB, were laminated in the order. The underlayer 9 serves as a lower electrode.

Next, an alloy represented by $Mg_{0.33}Al_{0.67}$ was formed on the first ferromagnetic layer 1 with a layer thickness of 0.5 nm, and natural oxidation was performed. The natural oxidation was by exposing it to air at a pressure of 100 Pa for 600 seconds (the first condition). After that, an alloy represented by $Mg_{0.33}Al_{0.67}$ was formed with a layer thickness of 0.5 nm, and natural oxidation was performed by exposing it to air at a pressure of 10 Pa for 600 seconds (the second condition). The tunnel barrier layer 3 (Mg—Al—O layer) was obtained.

Next, CoFeB was laminated as the second ferromagnetic layer 2 on the tunnel barrier layer 3 with a layer thickness of 1.5 nm to obtain the ferromagnetic tumid junction.

Next, an alloy represented by $Mg_{033}Al_{0.67}$ was formed with a layer thickness of 0.5 nm on the second ferromagnetic layer 2 and naturally oxidized. The natural oxidation was performed by exposing it to air at a pressure of 100 Pa for 600 seconds (the first condition). After that, an alloy represented by $Mg_{0.33}Al_{0.67}$ was formed into a film with a layer thickness of 0.5 nm, and natural oxidation was performed by exposing it to air at a pressure of 10 Pa for 600 seconds (the second condition), and metal oxidation was performed. The metal oxide layer 4 was obtained.

Next, CoFeB was formed with a layer thickness of 0.5 nm to obtain the functional layer 5. Next, Ta was laminated in the order with a layer thickness of 5 nm, and Ru was laminated in the order with a layer thickness of 5 nm to obtain the electrode 6. Then, the obtained laminate was heat-treated in a magnetic field of 10 kOe at 300° C. for 3 hours to crystallize the ferromagnetic tunnel junction and apply a uniaxial magnetic field to the first ferromagnetic layer 1.

The formed metal oxide layer 4 was a metal oxide layer 4 made of $MgAl_2O_4$ having no oxygen deficiency. Since there is no oxygen deficiency, the total molar ratio of metal elements to oxygen elements is 3:4, and the oxygen ratio to alloy 1 is 4/3=1.33.

According to the above-described process, the magnetoresistance effect element 10 of Comparative Example 4 was obtained.

Finally, heat treatment was performed at a temperature of 175° C. for 30 minutes while applying a magnetic field of 5 kOe to impart uniaxial magnetic anisotropy to the second ferromagnetic layer 2. The magnetoresistance effect element 10 had a columnar shape with a diameter of 80 nm.

As shown in Table 1, the barrier height of the metal oxide layer 4 made of $MgAl_2O_4$ having no oxygen deficiency is 7.8 eV.

Comparative Examples 1 to 3

Comparative Examples 1 to 3 are different from Comparative Example 4 in that the formation conditions of the metal oxide layer 4 were changed from Comparative Example 4. The oxygen ratio was adjusted to the range of 0.133 to 0.399 by controlling the oxygen flow rate and other conditions of the pressure arrangement in the formation conditions of the metal oxide layer 4. In the amount of oxygen expressed by the standardization with the oxygen ratio of 1 in Comparative Example 4, the standardized oxygen amounts of Comparative Example 1, Comparative Example 2 and Comparative Example 3 are 0.1, 0.2 and 0.3, respectively.

Examples 1 to 6

Examples 1 to 6 are different from Comparative Example 4 in that the formation conditions of the metal oxide layer 4 were changed from Comparative Example 4 in the same manner as in Comparative Examples 1 to 3 described above. The oxygen ratio was adjusted to the range of 0.532 to 1.197 by controlling the oxygen flow rate and other conditions of the pressure arrangement in the formation conditions of the metal oxide layer 4. In the amount of oxygen expressed by the standardization with the oxygen ratio of 1 in Comparative Example 4, the standardized oxygen amounts of Examples 1 to 6 are 0.4, 0.5, 0.6, 0.7, 0.8, and 0.9, respectively.

Example 7

In Example 7, the oxygen concentration in the metal oxide layer 4 is not uniform. Example 7 differs in that the oxygen concentration on the first surface of the metal oxide layer 4 in contact with the second ferromagnetic layer 2 was higher than the oxygen concentration on the second surface facing the first surface.

The oxygen concentration on the first surface was 90% of the tunnel barrier layer, and the oxygen concentration on the second surface was 20% of the tunnel barrier layer.

The process of forming a metal and oxidizing it was repeated multiple times so that the oxygen concentration of the first surface of the metal oxide layer 4 in contact with the second ferromagnetic layer 2 was higher than the oxygen concentration of the second surface facing the first surface. The degree of oxidation was lowered each time it was repeated.

Example 8

Example 8 is different in that the metal oxide layer was composed of two layers, and the film thickness per metal oxide layer was half that of the other Examples. After forming the second ferromagnetic layer, the process from the formation of the metal oxide layer to the formation of the functional layer was repeated twice to form the metal oxide layer composed of two layers. In the metal oxide layer composed of these two layers, the standardized oxygen amount per layer was 0.4.

TABLE 2

| | Oxygen ratio (to alloy 1) | Oxygen amount | RA (Increase rate (Standardized)) | PMA Strength (Standardized) | MR ratio (Increase rate (Standardized)) |
|---|---|---|---|---|---|
| C. Ex 1 | 0.13 | 0.1 | 0.01 | 0.01 | 1.98 |
| C. Ex 2 | 0.27 | 0.2 | 0.02 | 0.20 | 1.97 |
| C. Ex 3 | 0.40 | 0.3 | 0.03 | 0.60 | 1.95 |
| Ex 1 | 0.53 | 0.4 | 0.04 | 0.80 | 1.92 |
| Ex 8 | 0.53 | 0.4 | 0.04 | 0.95 | 1.92 |
| Ex 2 | 0.67 | 0.5 | 0.07 | 0.90 | 1.87 |
| Ex 7 | 0.73 | 0.55 | 0.09 | 0.98 | 1.83 |
| Ex 3 | 0.80 | 0.6 | 0.11 | 0.96 | 1.80 |
| Ex 4 | 0.93 | 0.7 | 0.18 | 0.98 | 1.69 |
| Ex 5 | 1.06 | 0.8 | 0.34 | 0.97 | 1.49 |
| Ex 6 | 1.20 | 0.9 | 0.64 | 0.98 | 1.22 |
| C. Ex 4 | 1.33 | 1 | 1.00 | 1.00 | 1.00 |

Figure 7:
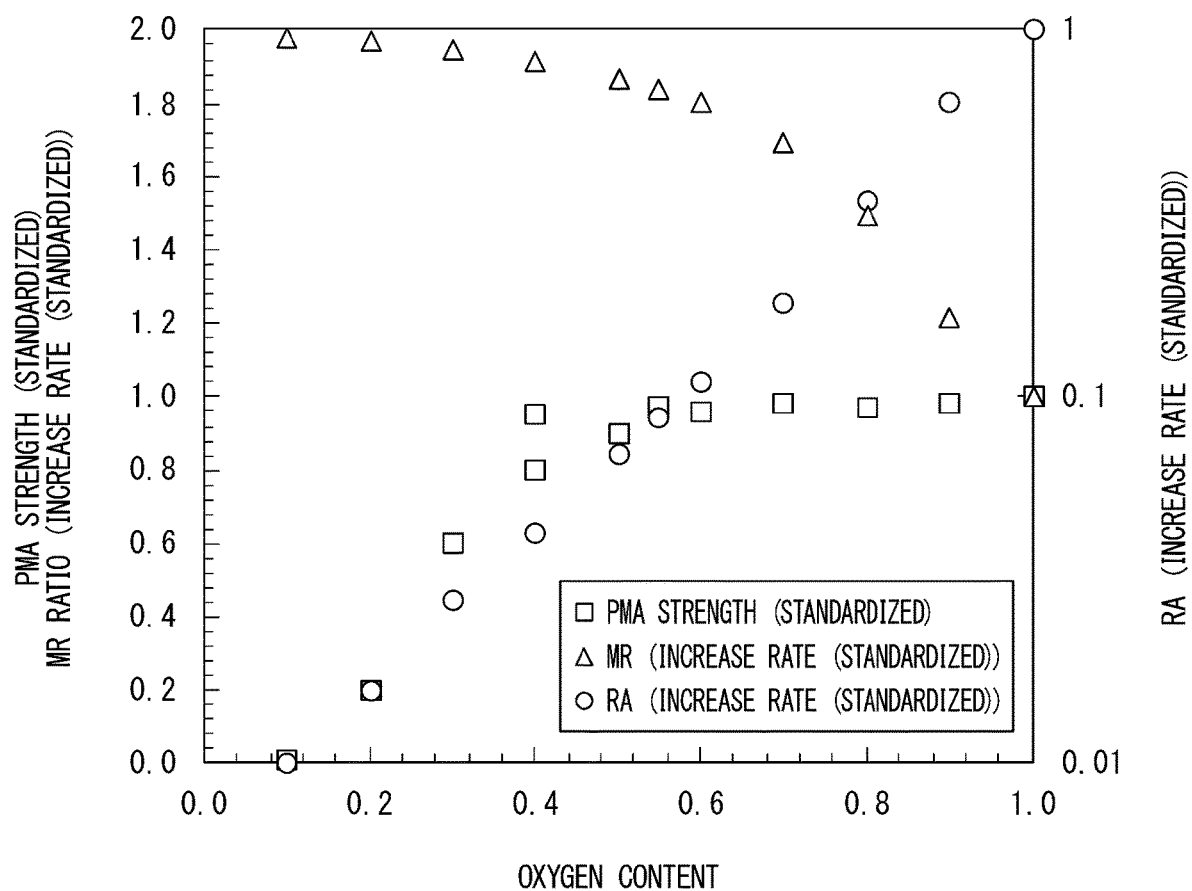
FIG. 7 is a graph showing relationships of the area resistance (RA), the perpendicular magnetic anisotropy (PMA), and the magnetoresistance ratio (MR ratio) of magnetoresistance effect elements produced as Examples and Comparative Examples corresponding to oxygen amounts in the metal oxide layers.

FIG. 7 is a graph showing relationships of the area resistance (RA), the perpendicular magnetic anisotropy (PMA), and the magnetoresistance ratio (MR ratio) of magnetoresistance effect elements produced as Examples 1 to 8 and Comparative Examples 1-4 corresponding to oxygen amounts in the metal oxide layers 4. RA, PMA and MR ratio are expressed as value standardized with respect to Comparative Example 4.

The graph plot in FIG. 7 is based on the values shown in Table 2, meaning that FIG. 7 is a visual presentation of Table 2 for easier grasping tendency of data in Table 2.

From Comparative Example 4 to Comparative Example 1, when the amount of oxygen in the metal oxide layer 4 decreases from 1 to 0.1 in 0.1 increments, the value of the area resistance RA in logarithmic representation on the vertical axis (FIG. 7). (Indicated by a circle symbol) decreased linearly. This indicates that there is a correlation between the amount of oxygen in the metal oxide layer 4 and the logarithmic area resistance RA.

The PMA of the second ferromagnetic layer 2 (indicated by a square symbol in FIG. 7) showed a correlation in the sense that the higher the oxygen content in the metal oxide layer 2, the higher the oxygen content, and the lower the oxygen content, the lower the oxygen content. However, this correlation did not show a linear correlation.

The PMA of the second ferromagnetic layer 2 maintained high values (0.8 or more) until the amount of oxygen in the metal oxide layer 4 decreased from 1.0 to about 0.4. When the oxygen amount was further decreased, the PMA of the second ferromagnetic layer 2 was decreased sharply.

This indicates that the resistivity of the magnetoresistance effect element 100 can be decreased without deteriorat g (lowering) PMA of the second ferromagnetic layer 2 as long as reduction of the oxygen amount in the metal oxide layer 4 being kept in a certain level (0.4, for example).

The change rate of the MR ratio (indicated by a triangular symbol in FIG. 7) as the magnetoresistance effect element 100 showed an inverse correlation with the amount of oxygen in the metal oxide layer 4. This inverse correlation was also not linear. The MR ratio of the magnetoresistance effect element 100 was maintained at a high value (about 1.49 or morel until the oxygen content of the metal oxide layer 4 rose from 0.0 to about 0.8. When the amount of oxygen increased further, it decreased sharply.

In Example 7, the oxygen concentration in the metal oxide layer 4 was not uniform, and the oxygen concentration on the first surface of the metal oxide layer 4 in contact with the second ferromagnetic layer 2 was higher than that on the second surface facing the first surface in the configuration. By having the configuration, it was possible to achieve a reduction in the area resistance RA of the metal oxide layer 4 and an improvement in the PMA strength of the second ferromagnetic layer at a high level that could not be achieved in Examples 1 to 6. In addition, the degree of decrease in the MR ratio could be suppressed to an extremely low level.

Specifically; the PMA strength in Example 7 was 0.97, which corresponded to the PMA strength (0.97) in Example 5 when the standardized oxygen amount was 0.8. The MR ratio in Example 7 was 1.83, which was equivalent to the MR ratio (1.87) in Example 2 when the standardized oxygen amount was 0.5.

In Example 8, by using two metal oxide layers, the decrease in MR ratio was the same as that in Example 1 which showed the same RA (Example 1: 1.92, Example 8: 1.92), higher PMA strength was obtained (Example 1: 0.80, Example 8: 0.95).

Next, relationships of: the area resistance (RA); the perpendicular magnetic anisotropy (PMA); and the magnetoresistance ratio (MR ratio), corresponding to the barrier height of the metal oxide layer of the magnetoresistance effect element produced as Examples 9 to 13 and Comparative Examples 4 to 5 were investigated.

Figure 8:
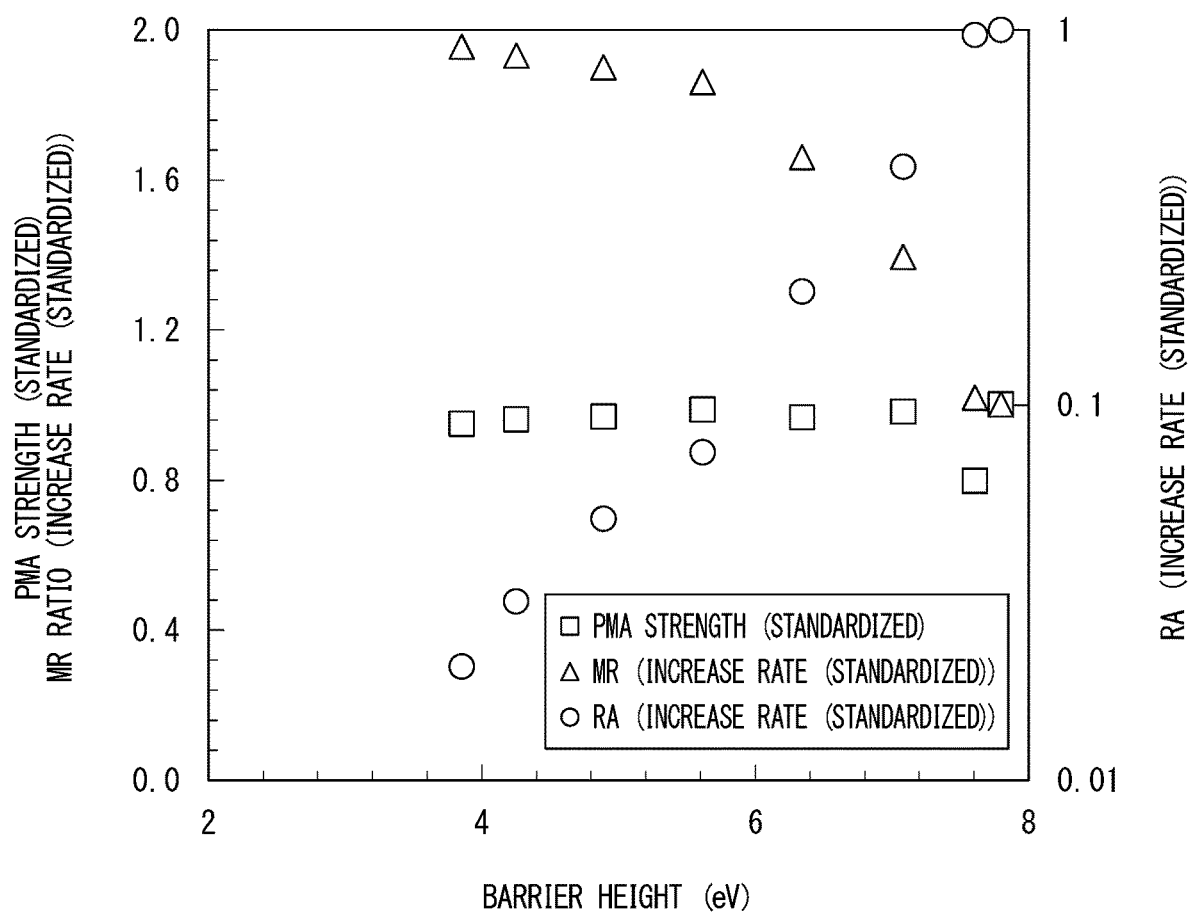
FIG. 8 is a graph showing relationships of the area resistance (RA), the perpendicular magnetic anisotropy (PMA), and the magnetoresistanceratio (MR ratio) of magnetoresistance effect elements produced as Examples and Comparative Examples corresponding to barrier heights in the metal oxide layers.

FIG. 8 a graph showing the relationships of: the area resistance (RA); the perpendicular magnetic anisotropy (PMA); and the magnetoresistance ratio (MR ratio), corresponding to the barrier height of the metal oxide layer of the magnetoresistance effect element produced as Examples 9 to 13 and Comparative Examples 4 to 5, Comparative Example 5

The composition of the metal oxide layer 4 was changed from $MgAl_2O_4$ to MgO, which was different from Comparative Example 4. The barrier height of the metal oxide constituting the metal oxide layer 4 was 7.6 eV.

Example 9

The composition of the metal oxide layer 4 was changed from $MgAl_2O_4$ to $ZnAl_2O_4$, which was different from Comparative Example 4. The barrier height of the metal oxide constituting the metal oxide layer 4 was 3.85 eV.

Example 10

The composition of the metal oxide layer 4 was changed from $MgAl_2O_4$ to $MgGa_2O_4$, which was different from Comparative Example 4. The barrier height of the metal oxide constituting the metal oxide layer 4 was 4.9 eV.

Example 11

The composition of the metal oxide layer 4 was changed from $MgAl_2O_4$ to $MgAlGaO_4(Al_{0.25}, Ga_{0.75})$, which was different from Comparative Example 4. The barrier height of the metal oxide constituting the metal oxide layer 4 was 5.62 eV.

Example 12

The composition of the metal oxide layer 4 was changed from $MgAl_2O_4$ to $MgAlGaO_4(Al_{0.5}, Ga_{0.5})$, which was different from Comparative Example 4. The barrier height of the metal oxide constituting the metal oxide layer 4 was 6.35 eV.

Example 13

The composition of the metal oxide layer 4 was changed from $MgAl_2O_4$ to $MgAlGaO_4(Al_{0.75}, Ga_{0.25})$, which was different from Comparative Example 4. The barrier height of the metal oxide constituting the metal oxide layer 4 was 7.08 eV.

Example 14

Example 14 differs from Comparative Example 4 in that the composition of the metal oxide layer 4 was changed from $MgAl_7O_4$ to $Mg_7TiO_4$. The barrier height of the metal oxide constituting the metal oxide layer 4 was 4.25 eV

TABLE 3

| | Composition of Metal oxide layer | Barrier height | RA (Increase rate (Standardized)) | PMA Strength (Standardized) | MR ratio (Increase rate (Standardized)) |
|---|---|---|---|---|---|
| Ex 9 | $ZnAl_2O_4$ | 3.85 | 0.02 | 0.95 | 1.96 |
| Ex 10 | $MgGa_2O_4$ | 4.9 | 0.05 | 0.97 | 1.9 |
| Ex 11 | $MgAlGaO_4$ $(Al_{0.25}, Ga_{0.75})$ | 5.62 | 0.075 | 0.99 | 1.86 |
| Ex 12 | $MgAlGaO_4$ $(Al_{0.5}, Ga_{0.5})$ | 6.35 | 0.2 | 0.97 | 1.66 |
| Ex 13 | $MgAlGaO_4$ $(Al_{0.75}, Ga_{0.25})$ | 7.08 | 0.43 | 0.98 | 1.4 |
| Ex 14 | $MgTiO_4$ | 4.25 | 0.03 | 0.96 | 1.93 |
| C. Ex 5 | MgO | 7.6 | 0.98 | 0.8 | 1.02 |

FIG. 8 is a graph showing the relationships of: the area resistance (RA); the perpendicular magnetic anisotropy (PMA); and the magnetoresistance ratio (MR ratio), corresponding to the barrier height of the metal oxide layer of the magnetoresistance effect element produced as Examples 9 to 13 and Comparative Examples 4 to 5.

The graph plot in FIG. 8 is based on the values shown in Table 3, meaning that FIG. 8 is a visual presentation of Table 3 for easier grasping tendency of data in Table 3.

Barrier height is the energy required to allow electrons to pass through the material. Therefore, there was a liner correlation between the barrier height and the area resistance RA (indicated by a circle symbol in FIG. 8) of the metal oxide layer 4, the area resistance being shown as a logarithm.

On the other hand, unlike the case of the amount of oxygen, no decrease in the PMA strength (indicated by a square symbol in FIG. 8) of the second ferromagnetic layer was observed with decrease of the barrier height since the barrier height is a physical property that is not directly related to the amount of oxygen of the metal oxide constituting the metal oxide layer 4.

The change rate of the MR ratio (indicated by a triangular symbol in FIG. 8) as the magnetoresistance effect element 100 shoved an inverse correlation with the barrier height constituting the metal oxide layer 4, as in the case of the amount of oxygen. This inverse correlation is also not linear, and the MR ratio of the magnetoresistance effect element 100 was maintained at high value (about 1.4 or more) until the barrier height constituting the metal oxide layer 4 rose from 3.85 to about 7.08. When the barrier height increased further, it decreased sharply.

INDUSTRIAL APPLICABILITY

In the magnetoresistance effect element, the increase in area resistance due to providing the cap layer can be suppressed without reducing the thickness of the cap layer.

REFERENCE SIGNS LIST

1: First ferromagnetic layer
2: Second ferromagnetic layer
3: Tunnel barrier layer
4: Metal oxide layer (1st metal oxide layer)
5: Functional layer
6: Electrode
7: Third ferromagnetic layer
8: Second metal oxide layer
9: Underlayer
10: Antiferromagnetic layer
11: Non-magnetic metal layer
12 Fourth ferromagnetic layer
100 magnetoresistance effect element
101 Contact
102 Power supply
103 Voltmeter
110: Magnetoresistance effect device

The invention claimed is:

1. A magnetoresistance effect element comprising:
a first ferromagnetic layer;
a second ferromagnetic layer;
a tunnel barrier layer disposed between the first and second ferromagnetic layers; and
a metal oxide layer in contact with a surface of the second ferromagnetic layer opposite to a surface in contact with the tunnel barrier layer, wherein
a ratio of oxygen is higher than a total ratio of metal elements in a composition formula expressed in a stoichiometric composition in a metal oxide constituting the metal oxide layer, and
an oxygen deficiency ratio of the metal oxide layer is higher than an oxygen deficiency ratio of the tunnel barrier layer.

2. A magnetoresistance effect element comprising:
a first ferromagnetic layer;
a second ferromagnetic layer;
a tunnel barrier layer disposed between the first and second ferromagnetic layers; and
a metal oxide layer in contact with a surface of the second ferromagnetic layer opposite to a surface in contact with the tunnel barrier layer, wherein
a ratio of oxygen is higher than a total ratio of metal elements in a composition formula expressed in a stoichiometric composition in a metal oxide constituting the metal oxide layer, and
a barrier height of the metal oxide constituting the metal oxide layer is lower than a barrier height of an oxide constituting of the tunnel barrier layer.

3. The magnetoresistance effect element according to claim 2, wherein the barrier height of the metal oxide constituting the metal oxide layer is less than a barrier height of MgO film having a same film thickness as the metal oxide layer.

4. The magnetoresistance effect element according to claim 1, wherein the metal oxide layer has a spinel structure containing one or more of divalent elements and one or more of trivalent elements selected from a group consisting of Mg, Al, Ga, Ti, In, Sn, Zn, Ge, Ag, Cu, Mn, Si, In, Pt, Cr, V, Rh, Mo, W, Fe, Co, and Ni.

5. The magnetoresistance effect element according to claim 1, wherein the metal oxide layer is made of $A_xB_{1-x}O_y$, (A=Mg, Sn, Zn, Ge, Cu, Mn, Si, Ti, Pt, V, Fe, Co; B=Al, Ga, In, Sn, Ge, Ag, Cu, Mn, Ti, Cr, V, Rh, Mo, W, Fe, Ni; $0 \leq x \leq 1$; $0.133 \leq y < 1.2$).

6. The magnetoresistance effect element according to claim 5, wherein
the metal oxide layer contains an oxide containing Mg and Al, and
the tunnel barrier layer contains an oxide of Mg.

7. The magnetoresistance effect element according to claim 5, wherein each of the metal oxide layer and the tunnel barrier layer is made of an oxide containing Mg and Al and having a spinel structure.

8. The magnetoresistance effect element according to claim 1, wherein an oxygen concentration on a first surface of the metal oxide layer is higher than an oxygen concentration on a second surface of the metal oxide layer, the first surface in contact with the second ferromagnetic layer and the second surface facing the first surface.

9. The magnetoresistance effect element according to claim 1, wherein
the tunnel barrier layer is an oxide layer containing Mg, and
the metal oxide layer is a layer made of one or more layers made of $A_xB_{1-x}O_y$ (A=Mg, Zn, Ti; B=Al, Ga, In, Ge, Ti; $0 \leq x \leq 1$; $0.133 \leq y < 1.2$).

10. The magnetoresistance effect element according to claim 1, wherein
the tunnel barrier layer is a layer made of an oxide containing Mg and Al, and
the metal oxide layer is a layer made of one or more layers made of $A_xB_{1-x}O_y$ (A=Mg, Zn, Ti; B=Al, Ga, In, Ge, Ti; $0 \leq x \leq 1$; $0.133 \leq y < 1.2$).

11. The magnetoresistance effect element according to claim 1, wherein
the tunnel barrier layer is a layer made of an oxide containing Mg and Ga, and the metal oxide layer is a layer made of one or more layers made of $A_xB_{1-x}O_y$ (A=Mg, Zn, Ti; B=Ga, In, Ge, Ti; $0 \leq x \leq 1$; $0.133 \leq y < 1.2$).

12. The magnetoresistance effect element according to claim 1, wherein
the tunnel barrier layer is a layer made of an oxide containing Mg and Ge, and
the metal oxide layer is a layer made of one or more layers made of $A_xB_{1-x}O_y$ (A=Mg, Zn, Ti; B=Ga, In, Ge, Ti; $0 \leq x \leq 1$; $0.133 \leq y < 1.2$).

13. The magnetoresistance effect element according to claim 1, further comprising one or more sets of a layer made of a third ferromagnetic layer and a second metal oxide layer on the metal oxide layer, and
the third ferromagnetic layer is disposed on a side of the tunnel barrier layer with respect to the second metal oxide layer of the set the third ferromagnetic layer belongs to.

14. The magnetoresistance effect element according to claim 5, wherein an oxygen concentration on a first surface of the metal oxide layer is higher than an oxygen concentration on a second surface of the metal oxide layer, the first surface in contact with the second ferromagnetic layer and the second surface facing the first surface.

15. The magnetoresistance effect element according to claim 8, wherein
the tunnel barrier layer is an oxide layer containing Mg, and
the metal oxide layer is a layer made of one or more layers made of $A_xB_{1-x}O_y$ (A=Mg, Zn, Ti; B=Al, Ga, In, Ge, Ti; $0 \leq x \leq 1$; $0.133 \leq y < 1.2$).

16. The magnetoresistance effect element according to claim 8, wherein
the tunnel barrier layer is a layer made of an oxide containing Mg and Al, and
the metal oxide layer is a layer made of one or more layers made of $A_xB_{1-x}O_y$ (A=Mg, Zn, Ti; B=Al, Ga, In, Ge, Ti; $0 \leq x \leq 1$; $0.133 \leq y < 1.2$).

17. The magnetoresistance effect element according to claim 8, wherein
the tunnel barrier layer is a layer made of an oxide containing Mg and Ga, and
the metal oxide layer is a layer made of one or more layers made of $A_xB_{1-x}O_y$ (A=Mg, Zn, Ti; B=Ga, In, Ge, Ti; $0 \leq x \leq 1$; $0.133 \leq y < 1.2$).

18. The magnetoresistance effect element according to claim 8, wherein
the tunnel barrier layer is a layer made of an oxide containing Mg and Ge, and
the metal oxide layer is a layer made of one or more layers made of $A_xB_{1-x}O_y$ (A=Mg, Zn, Ti; B=Ga, In, Ge, Ti; $0 \leq x \leq 1$; $0.133 \leq y < 1.2$).

19. The magnetoresistance effect element according to claim 17, wherein
the magnetoresistance effect element comprises one set of the layer made of the third ferromagnetic layer and the second metal oxide layer on the metal oxide layer,
the third ferromagnetic layer contacts a surface of the metal oxide layer opposite to a surface in contact with the second ferromagnetic layer, and
the second metal oxide layer contacts a surface of third ferromagnetic layer opposite to a surface in contact with the metal oxide layer.

* * * * *